(12) United States Patent
Kim et al.

(10) Patent No.: US 8,207,033 B2
(45) Date of Patent: Jun. 26, 2012

(54) METHODS OF FABRICATING DIFFERENT THICKNESS SILICON-GERMANIUM LAYERS ON SEMICONDUCTOR INTEGRATED CIRCUIT DEVICES AND SEMICONDUCTOR INTEGRATED CIRCUIT DEVICES FABRICATED THEREBY

(75) Inventors: Myung-Sun Kim, Gyeonggi-do (KR); Hwa-Sung Rhee, Gyeonggi-do (KR); Ho Lee, Chungcheongnam-do (KR); Ji-Hye Yi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 530 days.

(21) Appl. No.: 12/419,698

(22) Filed: Apr. 7, 2009

(65) Prior Publication Data

US 2009/0258463 A1    Oct. 15, 2009

(30) Foreign Application Priority Data

Apr. 10, 2008  (KR) ................... 10-2008-0033268

(51) Int. Cl.
*H01L 21/336*     (2006.01)

(52) U.S. Cl. ......... 438/245; 438/300; 438/481; 438/607

(58) Field of Classification Search .................. None
See application file for complete search history.

(56) References Cited

U.S. PATENT DOCUMENTS

| | | | |
|---|---|---|---|
| 7,816,217 B2 * | 10/2010 | Lin et al. | 438/300 |
| 2002/0113295 A1 * | 8/2002 | Nakamura | 257/640 |
| 2005/0079692 A1 * | 4/2005 | Samoilov et al. | 438/481 |

* cited by examiner

*Primary Examiner* — Zandra Smith
*Assistant Examiner* — Pamela E Perkins
(74) *Attorney, Agent, or Firm* — Myers Bigel Sibly & Sajovec, P.A.

(57) ABSTRACT

Methods of fabricating semiconductor integrated circuit devices are provided. A substrate is provided with gate patterns formed on first and second regions. Spaces between gate patterns on the first region are narrower than spaces between gate patterns on the second region. Source/drain trenches are formed in the substrate on opposite sides of the gate patterns on the first and second regions. A first silicon-germanium (SiGe) epitaxial layer is formed that partially fills the source/drain trenches using a first silicon source gas. A second SiGe epitaxial layer is formed directly on the first SiGe epitaxial layer to further fill the source/drain trenches using a second silicon source gas that is different from the first silicon source gas.

21 Claims, 4 Drawing Sheets

METHODS OF FABRICATING DIFFERENT THICKNESS SILICON-GERMANIUM LAYERS ON SEMICONDUCTOR INTEGRATED CIRCUIT DEVICES AND SEMICONDUCTOR INTEGRATED CIRCUIT DEVICES FABRICATED THEREBY

CROSS-REFERENCE TO RELATED APPLICATION

This application is based on and claims priority under 35 USC §119 to Korean Patent Application No. 10-2008-0033268, filed on Apr. 10, 2008, the disclosure of which is incorporated herein in its entirety by reference as if set forth fully herein.

BACKGROUND OF THE INVENTION

1. Field of the Invention

The present invention relates to methods of fabricating semiconductor integrated circuit devices, and more particularly, to methods of fabricating a silicon germanium layer on semiconductor integrated circuit devices and related semiconductor integrated circuit devices.

2. Description of the Prior Art In an attempt to improve the performance of semiconductor integrated circuit devices, many different techniques have been proposed to increase the speed of carriers flowing through a channel and/or to increase the density of electrons at the same carrier speed. For example, a technology has been proposed that forms a stress layer to provide a tensile stress to an n-type field effect transistor (nFET) region and to provide a compressive stress to a p-type field effect transistor (pFET) region. For pFET and eSiGe technology devices, silicon-germanium (SiGe) can be formed on an active region to apply a compressive stress to a channel using distortion that is created due to a difference in lattice length between silicon (Si) and germanium (Ge).

When forming a pFET active region using SiGe, it may be important to be able to grow SiGe without defects on a desired place and with a desired thickness. However, if the thickness of the grown SiGe is not uniform on the same wafer, different compressive stresses may be applied to channels of different semiconductor integrated circuit devices. The different compressive stresses may cause the semiconductor integrated circuit devices to have different performance characteristics, and may deteriorate the reliability of the semiconductor devices.

SUMMARY OF THE INVENTION

Various embodiments of the present invention may increase the reliability of semiconductor integrated circuit devices.

Some embodiments of the present invention are directed to methods of fabricating semiconductor integrated circuit devices. A substrate is provided with gate patterns formed on first and second regions. Spaces between gate patterns on the first region are narrower than spaces between gate patterns on the second region. Source/drain trenches are formed in the substrate on opposite sides of the gate patterns on the first and second regions. A first silicon-germanium (SiGe) epitaxial layer is formed that partially fills the source/drain trenches using a first silicon source gas. A second SiGe epitaxial layer is formed directly on the first SiGe epitaxial layer to further fill the source/drain trenches using a second silicon source gas that is different from the first silicon source gas.

Some other embodiments of the present invention are also directed to methods of fabricating semiconductor integrated circuit devices. A plurality of gate patterns are formed on a wafer within a center region and within an edge region of the wafer. Source/drain trenches are formed in the wafer on opposite sides of the gate patterns on the center and edge regions. A first silicon-germanium (SiGe) epitaxial layer is formed that partially fills the source/drain trenches using a first silicon source gas. A second SiGe epitaxial layer is formed directly on the first SiGe epitaxial layer to further fill the source/drain trenches using a second silicon source gas that is different from the first silicon source gas.

Some other embodiments of the present invention are directed to semiconductor integrated circuit devices. A semiconductor integrated circuit device can include a substrate having gate patterns on a first region and on a second region. Spaces between gate patterns on the first region are narrower than spaces between gate patterns on the second region. Source/drain trenches are in the substrate on opposite sides of the gate patterns. A first silicon-germanium (SiGe) epitaxial layer partially fills the source/drain trenches. Thicknesses of the first SiGe epitaxial layer on the first and second regions are different from each other. A second SiGe epitaxial layer is on the first SiGe epitaxial layer.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF THE PREFERRED EMBODIMENTS

Figure 1:
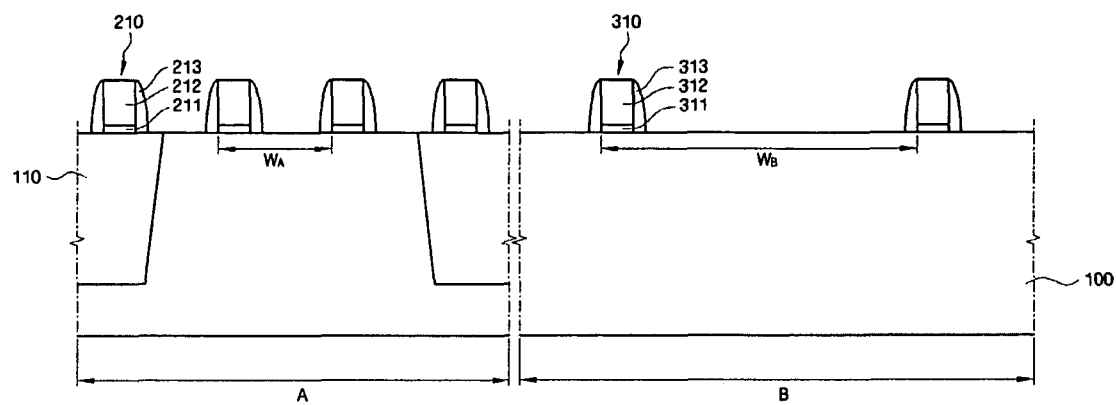
FIGS. 1 to 5 shows cross-sectional views of intermediate structures that illustrate various methods of fabricating semiconductor integrated circuit devices according to some embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses sizes of layers and regions are exaggerated for clarity. Like reference numerals in the drawings denote like elements. A semiconductor substrate described in the present specification denotes not only the semiconductor substrate itself, but also a structure in/on which the semiconductor substrate is formed by various processes.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Some embodiments of the present invention may arise from the present realization that when fabricating a semiconductor integrated circuit device, SiGe may be grown non-uniformly due to differences in spacing between gate patterns, and which may affect the reliability of the semiconductor devices.

FIGS. 1 to 5 shows cross-sectional views of intermediate structures that illustrate various methods of fabricating semiconductor integrated circuit devices according to some embodiments of the present invention.

Referring to FIG. 1, gate patterns 210 and 310 are formed on a substrate 100 in which a first region A and a second region B are defined. The substrate 100 may, without limitation, be a silicon substrate, a silicon on insulator (SOI) substrate, or a silicon-germanium substrate.

The substrate 100 includes the first region A and the second region B. The first region A and the second region B are discriminated from each other by the densities of gate patterns 210 and 310 that are formed on the substrate 100. For example, the gate patterns 210 are more formed more closely on the first region A compared to the gate patterns 310 that are formed on the second region B, and, accordingly, a space WA between the adjacent gate patterns 210 of the first region A is narrower than a space WB between the adjacent gate patterns 310 of the second region. Further, the first region A may be a cell region, and the second region B may be a peripheral circuit region. However, the first and second regions are not limited thereto, and may include all regions that can be discriminated based on the densities of the gate patterns 210 and 310.

Various methods will now be described in the context of fabricating PMOS transistors using the gate patterns 210 and 310. It is to be understood that the invention is not limited thereto and may be applied to fabricating NMOS transistors and other types of transistors. Although the NMOS transistors may differ from the PMOS transistors in the doped type of impurity and/or in other materials, it is possible to apply various embodiments herein to other types of transistors. Although the gate patterns 210 and 310 of the first and second regions A and B are denoted by different references in the drawings, it is merely for convenience in explanation, and the gate patterns may be substantially the same except for the spaces between them.

Formation of the gate patterns 210 and 310 includes forming gate insulating layers 211 and 311, gate electrodes 212 and 312, and gate side wall spacers 213 and 313 on the substrate. Specifically, the gate insulating layers 211 and 311 and the gate electrodes 212 and 312 are formed by forming the gate insulating layers and gate electrode layers on the substrate 100 and then pattering the formed layers. The spaces WA between the adjacent gate patterns 210 in the first region A are narrower than the spaces WB between the adjacent gate patterns 310 in the second region B.

A gate side wall spacer layer is then formed on the substrate 100, and the gate side wall spacers 213 and 313 are then formed on both side walls of the gate insulating layers 211 and 311 and the gate electrodes 212 and 312 through anisotropic etching of the gate side wall spacer layer. However, this is merely exemplary, and other methods may be performed by those skilled in the art in view of the present explanation.

The gate insulating layers 211 and 311 may be layers of silicon oxide (SiOx), silicon oxynitride (SiON), titanium oxide (TiOx), tantalum oxide (TaOx), and the like. The gate insulating layers 211 and 311 may be deposited, for example, by thermal oxidation, chemical vapor deposition (CVD), sputtering, or the like.

The gate electrodes 212 and 312 are formed on the gate insulating layers 211 and 311, and are made of conductive materials. For example, it may be a single layer including polysilicon doped with n-type or p-type impurities, metal such as tungsten, molybdenum, or the like, metal silicide, conductive metal nitride, and the like, or a laminated layer thereof.

The gate side wall spacers 213 and 313, for example, can be formed from an insulating material such as silicon oxide, silicon nitride, silicon oxynitride, and the like, and its thickness may be defined to provide desired characteristics for the resulting semiconductor integrated circuit.

An active region may be defined on the substrate 100 by forming an element separation region 110. The element separation region 110 may be formed by using a local oxidation of silicon (LOCOS) or shallow trench isolation (STI) process. Although the element separation region 110 is shown only in the first region A in the drawing, it may also be formed to define an active region on the second region B.

Figure 2:
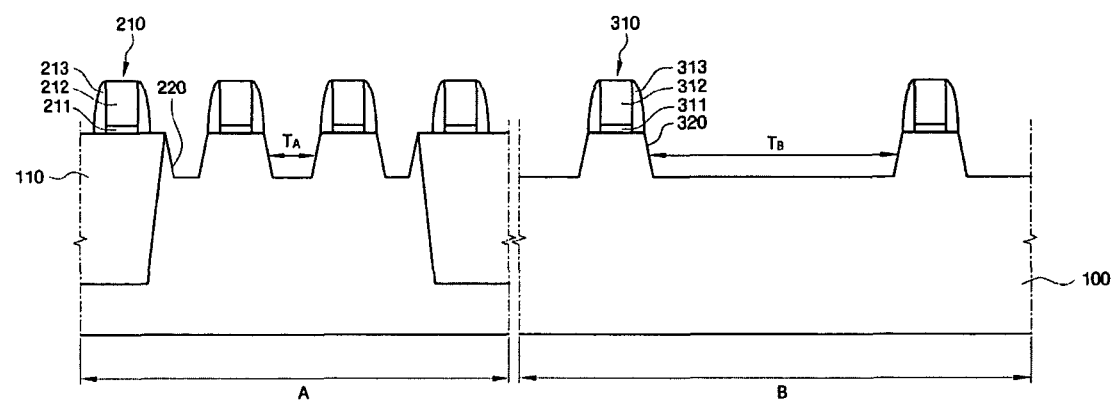

Referring now to FIG. 2, source/drain trenches 220 and 320 are formed on opposite sides of the gate patterns 210 and 310 of the first and second regions A and B in the substrate 100 through an etching process. The etching process may be wet etching, dry etching, or a combination thereof, which can perform selective removal of the substrate 100.

The width TA of the source/drain trenches 220 formed in the first region A may be set to be narrower than the width TB of the source/drain trenches 320 in the second region B. Such width differences can be constrained by the spaces (See WA in FIG. 1) between the adjacent gate patterns 210 of the first region A being narrower than the spaces (See WB in FIG. 1) between the adjacent gate patterns 310 of the second region B as described above.

The source/drain trenches 220 and 320 may be formed aligned with the gate side wall spacers 213 and 313 on opposite side walls of the gate patterns 210 and 310.

Figure 3:
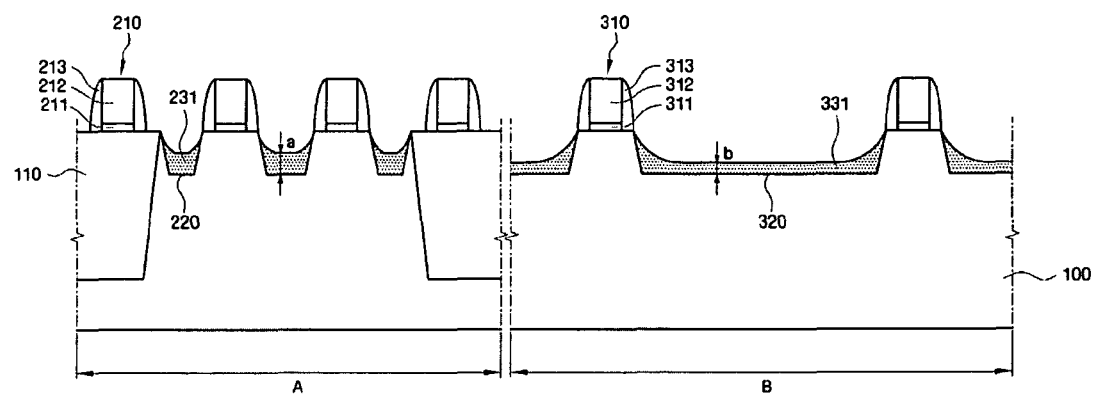

Referring now to FIG. 3, first SiGe epitaxial layers 231 and 331 that partially fill the source/drain trenches 220 and 320 are formed using a first source gas. Specifically, formation of the first SiGe epitaxial layers 231 and 331 may include, for example, carrying out a selective epitaxial growth process with the first source gas including the first silicon source gas. In this case, the selective epitaxial growth may be performed through, but is not limited to, a chemical vapor deposition (CVD) process, a reduced pressure chemical vapor deposition (RPCVD) process, an ultrahigh vacuum chemical vapor deposition (UHVCVD) process, or the like.

The first source gas includes the first silicon source gas, and the first silicon source gas may be, for example, one of a dichlorosilane ($SiCl_2H_2$) gas and a silane ($SiH_4$) gas. After forming the first SiGe epitaxial layer, the second SiGe epitaxial layer can be formed on the first SiGe epitaxial layer using a second silicon source gas to further fill the source/drain trenches 220 and 320. In this case, the second silicon source gas may be the other of the dichlorosilane gas and the silane gas that was used to form the first SiGe epitaxial layer. In other words, the first and second silicon source gases are different from each other, as will be explained further below.

In addition, the first source gas may include a first germanium source gas, for example, $GeH_xCl_y$ such as $GeH_4$, $Ge_2H_6$, or GeCl. In this case, by adjusting the germanium content of the germanium source gas, the germanium density of the first SiGe epitaxial layers 231 and 331 can be substantially changed. The germanium density of the first SiGe epitaxial layers 231 and 331 may be, but is not limited to, 5% to 50%.

The first SiGe epitaxial layers 231 and 331 are formed to partially fill the source/drain trenches 220 and 320, and the resulting thickness of the first SiGe epitaxial layer 231 of the first region A is different from the thickness of the first SiGe epitaxial layer 331 of the second region B. As illustrated in the drawings, the thickness "a" of the first SiGe epitaxial layer 231 on the first region A may be set to be larger than the thickness "b" of the first SiGe epitaxial layer 331 on the second region B. However, this is merely exemplary, and the thickness b or the first SiGe epitaxial layer 331 on the second region B may be set to be larger than the thickness a of the first SiGe epitaxial layer 231 on the first region A.

That is, depending on which gas has been used as the first silicon gas, and particularly depending on the growth profile of the gas used as the first silicon source gas is, the thicknesses of the first SiGe epitaxial layers 231 and 331 on the first and second regions may differ from each other. Here, the term "growth profile" can refer to the characteristic rate at which the SiGe epitaxial layers are formed in the source/drain trenches 220 and 320.

For example, when filling the source/drain trenches 220 and 320 using the dichlorosilane gas, the SiGe epitaxial layers may be grown by forming facets in portions where the gate patterns 210 and 310 or the element separation regions 110 are in contact with the source/drain trenches 220 and 320. The facets can be formed on opposite sides of the source/drain trenches 220 in the first region A and can be spaced apart by relatively small distances, thereby resulting in the formation of a relatively thick first SiGe epitaxial layer 231 as the first SiGe epitaxial layer 231 grows therebetween.

In contrast, because the space between the gate patterns 310 is relatively wider in the second region B, the facets formed on opposite sides of the source/drain trenches 320 are not in contact with each other, and center portions of the source/drain trenches 320 become relatively thin to form reverse facets. When using the dichlorosilane gas as the first silicon source gas, the thickness a of the first SiGe epitaxial layer 231 formed on the first region A is larger than the thickness b of the first SiGe epitaxial layer 231 formed on the second region B as shown in the drawing.

In contrast, when filling the source/drain trenches 220 and 320 using the silane gas, the facets may not be formed. However, a gas depletion phenomenon may occur in the first region A where a larger number of source/drain trenches 220 are formed in comparison to the second region B. Accordingly, although not separately illustrated in the drawings, the first SiGe epitaxial layer is formed on the first region A with a thickness that is smaller than that of the first SiGe epitaxial layer on the second region B.

Figure 4:
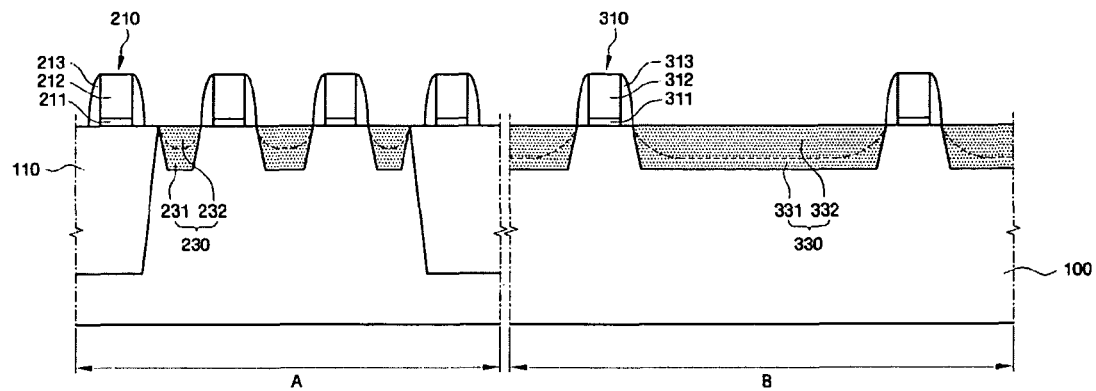

Referring now to FIG. 4, second SiGe epitaxial layers 232 and 332 are formed using the second source gas including the second silicon source gas. As described above, the second source gas includes the second silicon source gas that is different from the first silicon source gas. For example, in the case where the first silicon source gas is the dichlorosilane gas, the second silicon source gas may be the silane gas, or vice versa.

The second silicon source gas may have a growth profile that is different from that of the first silicon source gas, and further, the first silicon source gas and the second silicon source gas may have mutually complementary growth profiles. Here, the term "complementary" means that the silicon source gases having different growth profiles have mutually contradictory growth profiles with respect to the same region (i.e., the first or second region) in order to form the desired SiGe epitaxial layers 230 and 330. Specifically, in a region where the gate patterns 210 are closely formed such as the first region A, the silicon source gas, whereby the thick SiGe epitaxial layer is formed, and the silicon gas, whereby the thin SiGe epitaxial layer is formed, may have mutually complementary profiles.

For example, in the case of using the dichlorosilane gas as the first silicon source gas and using the silane gas as the second silicon source gas, as shown in the drawing, the first SiGe epitaxial layer 231 of the first region A may be formed with a thickness larger than that of the first SiGe epitaxial layer of the second region B. Accordingly, in order to form the SiGe epitaxial layers 230 and 330 with substantially the same thickness on the first region A and the second region B, it is required to form the second SiGe epitaxial layer 232 of the first region A with a thickness that is smaller than that of the second SiGe epitaxial layer 332 of the second region B. In other words, on the first region A, the first SiGe epitaxial layer 231 is formed relatively thick while the second SiGe epitaxial layer 232 is formed relatively thin. The thicknesses of the first SiGe epitaxial layer 331 and the second SiGe epitaxial layer 332 formed on the second region B may be opposite to those on the first region A.

Also, in the case of using the silane gas as the first silicon source gas and using the dichlorosilane gas as the second silicon source gas, substantially the same process may be performed except that the thicknesses of the first and second SiGe epitaxial layers differ from those as described above.

Although the dichlorosilane gas and the silane gas have been exemplified as the silicon source gases, they are not limited thereto, and any other source gases having different growth profiles may be used as needed.

Although not particularly illustrated in the drawings, the doping of impurities may be performed in-situ during the selective epitaxial growth process without breaking vacuum seal. Also, the impurity doping may be performed as a separate process after carrying out the selective epitaxial growth process.

With respect to the second source gas, the second germanium source gas may be substantially the same as the first germanium source gas as described above. The germanium density of the second SiGe epitaxial layers 232 and 332 may be, but is not limited to, 5% to 50%.

Selectively, although not particularly illustrated in the drawings, Si epitaxial layers may be formed after the SiGe epitaxial layers 230 and 330 are formed. In a silicide layer forming process that may be subsequently performed, the silicide layers consume Si atoms below the silicide layers, and this may cause the final thicknesses of the SiGe epitaxial layers 230 and 330 to be changed. Accordingly, in an attempt to prevent this result, the Si epitaxial layers can be formed with a specified thickness on the SiGe epitaxial layers 230 and 330 in consideration of Si being consumed during the forming of the silicide layers.

Figure 5:
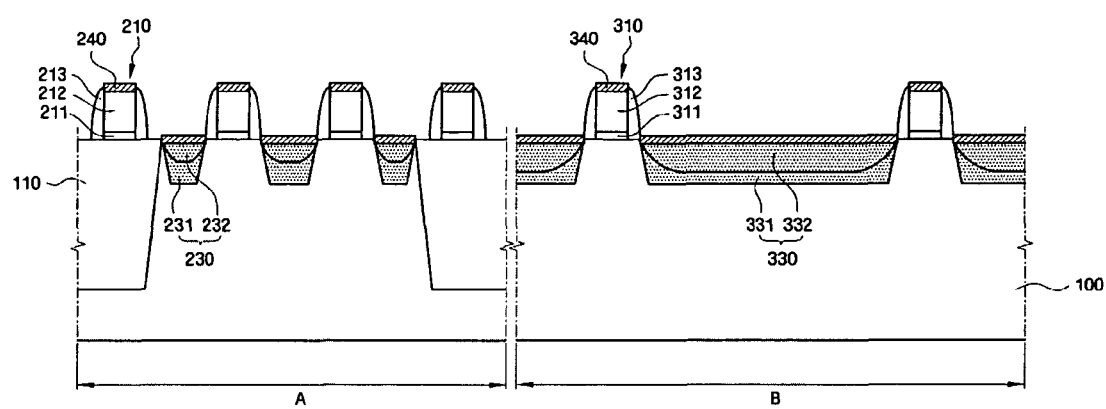

With reference now to FIG. 5, the silicide layers 240 and 340 are formed. Specifically, a metal layer is formed on the substrate 100, and the silicide layers 240 and 340 are formed by proceeding with a reaction heat-treatment process. The metal layer may be formed on a front surface of the substrate 100 using a sputtering process. Also, according to desired design circumstances, the metal layer may be selectively formed on surfaces of the SiGe epitaxial layers 230 and 330 and gate electrodes 212 and 312 using an electroless plating method. Then, by proceeding with the reaction heat-treatment process, the silicide layers 240 and 340 are formed. The particular process for forming the silicide layers and the particular process for removing the non-reactive metal layer are included in one or more processes that are well known to those skilled in the art, and thus the description thereof will be omitted for brevity.

Accordingly, fabrication of a semiconductor integrated circuit device according to some embodiments of the present invention can include forming SiGe epitaxial layers by successively using different silicon source gases so that the resulting SiGe epitaxial layers can having substantially the same thickness although different spaces are provided between the gate patterns in the different regions. As a result, the reliability of the semiconductor integrated circuit device may be greatly improved.

Figure 6:
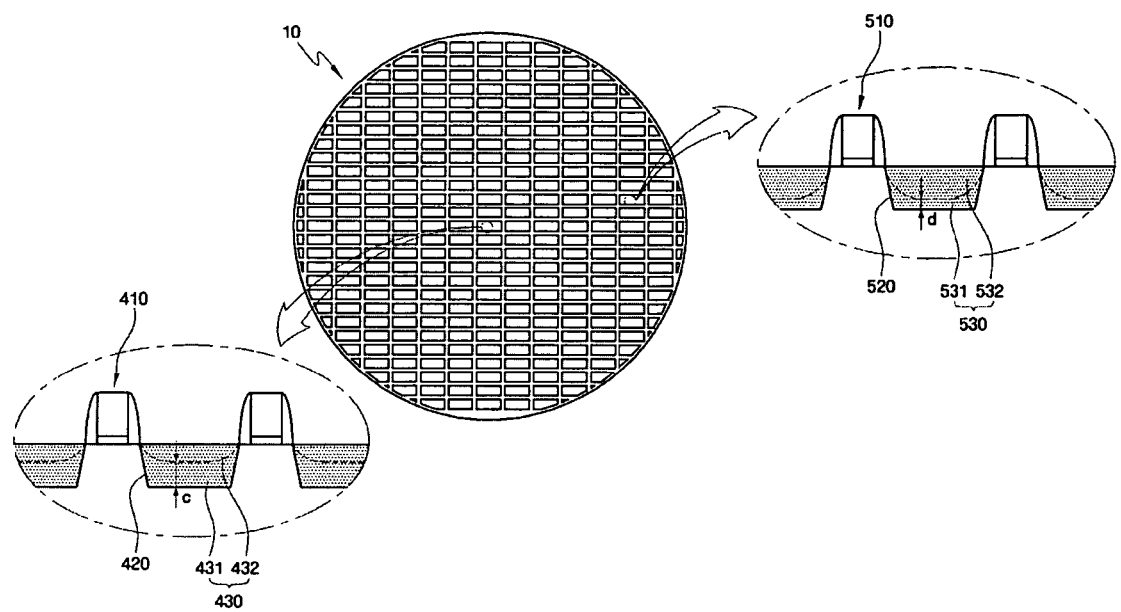
FIG. 6 shows a plan view and related cross-section view of structures that illustrate further methods of fabricating semiconductor integrated circuit devices according to some other embodiments of the present invention.

Referring now to FIG. 6, various methods of fabricating a semiconductor integrated circuit device according to some other embodiments of the present invention will be described. SiGe epitaxial layers are formed at a wafer level. The process of forming the SiGe epitaxial layers 430 and 530 on the wafer 10 are described below with the exception of where the process may be the same as those described above, and where such similar description will be omitted for brevity.

Referring to FIG. 6, a plurality of gate patterns 410 and 510 are formed on a wafer 10 including a center region and an edge region, and source/drain trenches 420 and 520 are formed in the wafer 10 exposed on both sides of the gate patterns 410 and 510. First SiGe epitaxial layers 431 and 531 are formed using a first source gas including a first silicon source gas. Then, second SiGe epitaxial layers 432 and 532 are formed on the first SiGe epitaxial layers 431 and 531 using a second gas including a second silicon source gas that is different from the first silicon source gas.

The first and second silicon source gases may be different from each other. For example, the first and second silicon source gases may be a dichlorosilane gas and a silane gas, respectively, or vice versa.

Also, growth profiles of the silicon source gases may differ even on the wafer 10. For example, the deposition of the dichlorosilane gas having the characteristics of temperature-sensitive reaction is actively performed in the center region having a relatively higher temperature than the edge region of the wafer. Accordingly, the width c of the first SiGe epitaxial layer 431 on the center region may be larger than the width d of the first SiGe epitaxial layer 531 on the edge region. By contrast, the first SiGe epitaxial layer may be formed on the edge region with a thickness much larger than that of the first SiGe epitaxial layer formed on the center region due to the gas depletion phenomenon of the silane gas.

That is, the dichlorosilane gas and the silane gas have different profiles even at a wafer level, and further have mutually complementary growth profiles. Accordingly, by successively depositing the first and second SiGe epitaxial layers by using the dichlorosilane gas and the silane gas as the first and second silicon source gases, respectively, the SiGe epitaxial layers 430 and 530 having substantially the same thickness are formed on the center region and the edge region, and thus semiconductor integrated circuit device having much more improved reliability can be manufactured. At this time, the silane gas and the dichlorosilane gas may be used as the first silicon source gas and the second silicon source gas, respectively, and by successively depositing the different silicon source gases, the SiGe epitaxial layers 430 and 530 can be formed.

Referring again to FIG. 5, a semiconductor integrated circuit device fabricated by the method according to the embodiments of the present invention will be described.

Referring to FIG. 5, the semiconductor integrated circuit device according to the embodiments of the present invention includes a substrate 100 on which gate patterns 210 and 310 are formed, source/drain trenches 220 and 320 formed in the substrate 100 on both sides of the gate patterns 210 and 310, first SiGe epitaxial layers 231 and 331 formed on the first and second regions A and B with different thicknesses, and second SiGe epitaxial layers 232 and 332 formed on the first SiGe epitaxial layers 231 and 331.

The substrate 100 includes the first region A and the second region B, and the space between the adjacent gate patterns 210 on the first region A is narrower than the space between the adjacent gate patterns 210 on the second region B. Also, the gate patterns 210 and 310 may include gate insulating layers 211 and 311, gate electrodes 212 and 312, and gate side wall spacers 213 and 313. In the substrate 100 on both sides of the gate patterns 210 and 310, the source/drain trenches 220 and 320 are formed, and the source/drain trenches 220 and 320 align with the gate side wall spacers 213 and 313.

The source/drain trenches 220 and 320 are buried by the SiGe epitaxial layers 230 and 330, and the SiGe epitaxial layers 230 and 330 are composed of first and second SiGe epitaxial layers 231, 232, 331, and 332. In this case, the first and second SiGe epitaxial layers 231, 232, 331 and 332 are formed with different thicknesses on the first region A or the second region B.

Specifically, the first and second SiGe epitaxial layers 231 and 232 on the first region A are formed with different thickness, and for example, the first SiGe epitaxial layer 231 is formed with a thickness larger than that of the second SiGe epitaxial layer 232. Also, the first SiGe epitaxial layer 231 is formed with different thicknesses in the first region A and the second region B, and for example, the first SiGe epitaxial layer 231 of the first region A is formed with a thickness larger than the SiGe epitaxial layers 331 of the region B.

As described above, the first and second SiGe epitaxial layers 231, 232, 331, and 332 having different thicknesses may differ depending on the gases used as the first and second silicon source gases. Accordingly, by successively depositing the first and second SiGe epitaxial layers 231, 232, 331, and 332 using the silicon source gases having different growth profiles as the first and second silicon source gases, respectively, the SiGe epitaxial layers 230 and 330 are formed, in which the sum of the thicknesses of the first and second SiGe epitaxial layers 231, 232, 331, and 332 is substantially uniform between the regions A and B.

Accordingly a semiconductor integrated circuit device may be manufactured so that the SiGe epitaxial layers include first and second SiGe epitaxial layers having different thicknesses, but also in which the SiGe epitaxial layers having substantially the same thickness irrespective of differences in spaces between adjacent gate patterns. Accordingly, the SiGe epitaxial layers may be formed with similar thicknesses even between regions that have different gate densities, and which may thereby improve reliability of the device.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of fabricating a semiconductor integrated circuit device, comprising:
   providing a substrate with gate patterns formed on first and second regions, wherein spaces between gate patterns on the first region are narrower than spaces between gate patterns on the second region;
   forming source/drain trenches in the substrate on opposite sides of the gate patterns on the first and second regions;
   forming a first silicon-germanium (SiGe) epitaxial layer that partially fills the source/drain trenches using a first silicon source gas, wherein forming the first SiGe epitaxial layer comprises growing the first SiGe epitaxial layer on exposed portions of the substrate on the first region at a greater than the first SiGe epitaxial layer is grown on exposed portions of the substrate on the second region so that the first SiGe epitaxial layer in the source/drain trenches on the first region is thicker than the first SiGe epitaxial layer in the source/drain trenches on the second region; and
   forming a second SiGe epitaxial layer directly on the first SiGe epitaxial layer to further fill the source/drain trenches using a second silicon source gas that is different from the first silicon source gas.

2. The method of claim 1, wherein:
   the first silicon source gas comprises a dichlorosilane gas; and
   the second silicon source gas comprises a silane gas.

3. The method of claim 1, wherein:
   the first silicon source gas comprises a silane gas; and
   the second silicon source gas comprises a dichlorosilane gas.

4. The method of claim 1, wherein forming the second SiGe epitaxial layer comprises growing the second SiGe epitaxial layer on the first SiGe epitaxial layer on the second region at a greater rate than the second SiGe epitaxial layer is grown on the first SiGe epitaxial layer on the first region, so that the second SiGe epitaxial layer on the second region is thicker than the second SiGe epitaxial layer on the first region, and so that a sum of the thicknesses of the first and second SiGe epitaxial layers is substantially the same in the first and second regions.

5. The method of claim 1, wherein the first region comprises device structures that define a cell region, the second region comprises device structures that define a peripheral circuit region, and the device structures in the cell region have a higher density than the device structures in the peripheral circuit region.

6. The method of claim 1, wherein the first and second source gases comprise first and second germanium source gases having different germanium content from each other.

7. The method of claim 1, wherein the first and second silicon source gases have different growth profiles.

8. The method of claim 1, further comprising forming a silicide layer on the second SiGe epitaxial layer after the second SiGe epitaxial layer has been formed.

9. The method of claim 1, wherein forming the first and second SiGe epitaxial layers comprises forming the first and second SiGe epitaxial layers with different thicknesses.

10. A method of fabricating a semiconductor integrated circuit device, comprising:
    providing a substrate with gate patterns formed on first and second regions, wherein spaces between gate patterns on the first region are narrower than spaces between gate patterns on the second region;
    forming source/drain trenches in the substrate on opposite sides of the gate patterns on the first and second regions;
    forming a first silicon-germanium (SiGe) epitaxial layer that partially fills the source/drain trenches using a first silicon source gas, wherein forming the first SiGe epitaxial layer comprises forming the first SiGe epitaxial layer in the second region with a thickness that is greater than a thickness of the first SiGe epitaxial layer in the first region; and
    forming a second SiGe epitaxial layer directly on the first SiGe epitaxial layer to further fill the source/drain trenches using a second silicon source gas that is different from the first silicon source gas.

11. The method of claim 10, wherein:
    the first silicon source gas comprises a dichlorosilane gas; and
    the second silicon source gas comprises a silane gas.

12. The method of claim 10, wherein:
    the first silicon source gas comprises a silane gas; and
    the second silicon source gas comprises a dichlorosilane gas.

13. The method of claim 10, wherein forming the second SiGe epitaxial layer comprises growing the second SiGe epitaxial layer on the first SiGe epitaxial layer on the second region at a greater rate than the second SiGe epitaxial layer is grown on the first SiGe epitaxial layer on the first region, so that the second SiGe epitaxial layer on the second region is thicker than the second SiGe epitaxial layer on the first region, and so that a sum of the thicknesses of the first and second SiGe epitaxial layers is substantially the same in the first and second regions.

14. The method of claim 10, wherein the first region comprises device structures that define a cell region, the second region comprises device structures that define a peripheral circuit region, and the device structures in the cell region have a higher density than the device structures in the peripheral circuit region.

15. The method of claim 10, wherein the first and second source gases comprise first and second germanium source gases having different germanium content from each other.

16. The method of claim 10, wherein the first and second silicon source gases have different growth profiles.

17. The method of claim 10, further comprising forming a silicide layer on the second SiGe epitaxial layer after the second SiGe epitaxial layer has been formed.

18. The method of claim 10, wherein forming the first and second SiGe epitaxial layers comprises forming the first and second SiGe epitaxial layers with different thicknesses.

19. A method of fabricating a semiconductor integrated circuit device, comprising:
forming a plurality of gate patterns on a wafer within a center region and within an edge region of the wafer;
forming source/drain trenches in the wafer on opposite sides of the gate patterns on the center and edge regions;
forming a first silicon-germanium (SiGe) epitaxial layer that partially fills the source/drain trenches using a first silicon source gas, wherein the forming the first SiGe epitaxial layer comprises forming the first SiGe epitaxial layer in the source/drain trenches on the center region to have a greater thickness than the first SiGe epitaxial layer in the source/drain trenches on the edge region; and
forming a second SiGe epitaxial layer directly on the first SiGe epitaxial layer to further fill the source/drain trenches using a second silicon source gas that is different from the first silicon source gas.

20. The method of claim 19, wherein:
the first silicon source gas comprises a dichlorosilane gas; and
the second silicon source gas comprises a silane gas.

21. The method of claim 19, wherein the first and second source gases comprise first and second germanium source gases having different germanium content from each other.

* * * * *